(12) United States Patent
Apalkov et al.

(10) Patent No.: US 11,348,627 B2
(45) Date of Patent: May 31, 2022

(54) RACE-TRACK MEMORY WITH IMPROVED DOMAIN WALL MOTION CONTROL

(71) Applicant: Samsung Electronics Co., Ltd., Gyeonggi-do (KR)

(72) Inventors: Dmytro Apalkov, San Jose, CA (US); Sungchul Lee, Kyunggi-do (KR); Roman Chepulskyy, Santa Clara, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/127,732

(22) Filed: Dec. 18, 2020

(65) Prior Publication Data

US 2022/0068338 A1 Mar. 3, 2022

Related U.S. Application Data

(60) Provisional application No. 63/072,807, filed on Aug. 31, 2020.

(51) Int. Cl.
*G11C 11/00* (2006.01)
*G11C 11/16* (2006.01)
*G11C 11/18* (2006.01)

(52) U.S. Cl.
CPC ........ *G11C 11/161* (2013.01); *G11C 11/1675* (2013.01); *G11C 11/18* (2013.01)

(58) Field of Classification Search
CPC .............. G11C 11/161; G11C 11/1675; G11C 19/0841; G11C 11/15; G11C 11/1673; H01L 27/226; H01L 43/02; H01L 43/08
See application file for complete search history.

(56) References Cited

U.S. PATENT DOCUMENTS

| | | | |
|---|---|---|---|
| 9,905,310 B2 | 2/2018 | Moon | |
| 10,020,039 B2 | 7/2018 | Fukami | |
| 10,062,449 B2 | 8/2018 | Choe | |
| 10,276,224 B2 | 4/2019 | Morise | |
| 10,592,802 B2 | 3/2020 | Sengupta | |
| 2011/0292718 A1* | 12/2011 | Suzuki | G11C 11/16 365/158 |
| 2013/0250668 A1* | 9/2013 | Fukuzawa | G11C 21/00 365/158 |
| 2019/0189516 A1* | 6/2019 | Sasaki | G11C 11/1673 |
| 2020/0051725 A1* | 2/2020 | Xiao | G06N 10/00 |
| 2020/0303457 A1* | 9/2020 | Ootera | G11C 11/1675 |

* cited by examiner

*Primary Examiner* — Hien N Nguyen
(74) *Attorney, Agent, or Firm* — Lewis Roca Rothgerber Christie LLP

(57) ABSTRACT

A system including a racetrack memory layer is described. The racetrack memory layer includes a plurality of bit locations and a plurality of domain wall traps. The bit locations are interleaved with the domain wall traps. Each of the bit locations has a first domain wall speed. Each of the domain wall traps has a second domain wall speed. The first domain wall speed is greater than the second domain wall speed. The first domain wall speed and the second domain wall speed are due to at least one of a Dzyaloshinskii-Moriya interaction variation in the racetrack memory layer, a synthetic antiferromagnetic effect variation in the racetrack memory layer, and a separation distance for the plurality of domain wall traps corresponding to an intrinsic travel distance. The separation distance is less than one hundred nanometers.

20 Claims, 5 Drawing Sheets

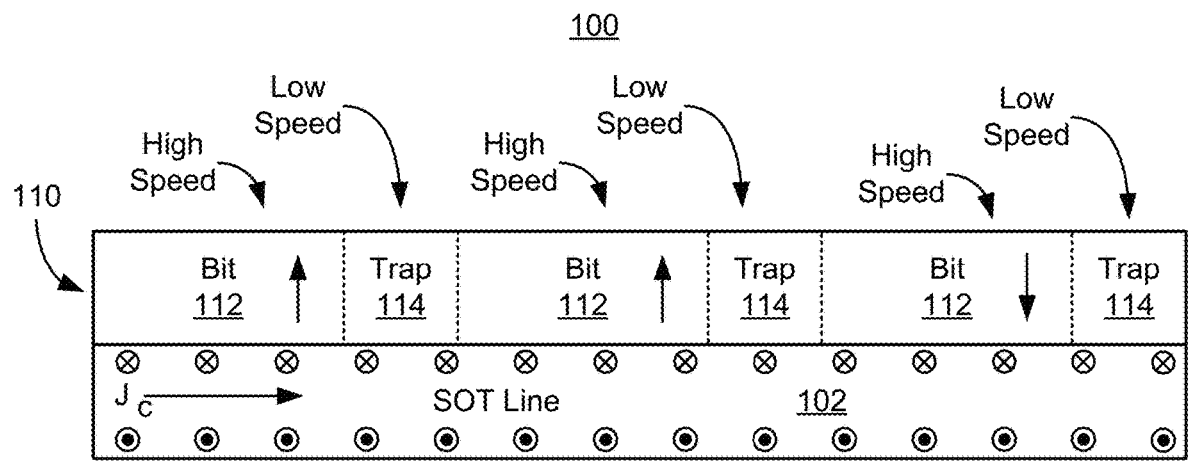
FIG. 1A
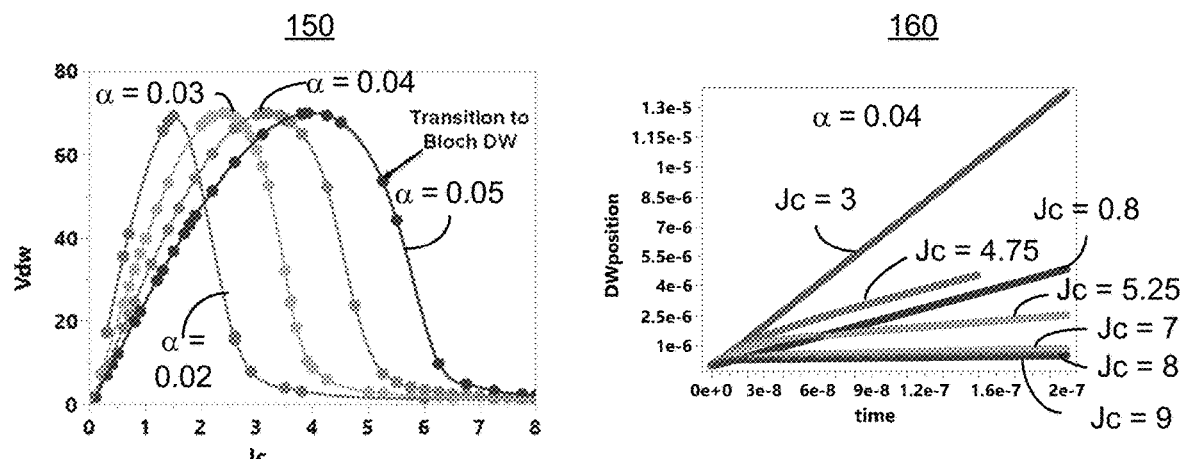
FIG. 1B
FIG. 1C
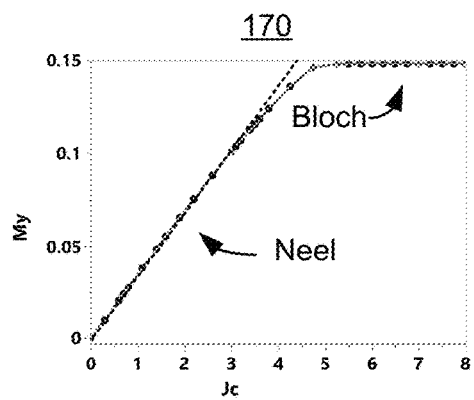
FIG. 1D

US 11,348,627 B2

RACE-TRACK MEMORY WITH IMPROVED DOMAIN WALL MOTION CONTROL

CROSS REFERENCE TO OTHER APPLICATIONS

This application claims priority to U.S. Provisional Patent Application No. 63/072,807 entitled RACE-TRACK MEMORY (RTM) WITH IMPROVED DW CONTROL BY DMI MODULATION filed Aug. 31, 2020 which is incorporated herein by reference for all purposes.

BACKGROUND OF THE INVENTION

A racetrack memory includes a line divided into bits. Each bit stores the information magnetically, by having its moment oriented in a first direction (a logical "1") or in a second direction opposite to the first direction (a logical "0"). In order to program the racetrack memory, the domain wall between bits is moved. Some racetrack memories rely on spin-orbit torque (SOT) to move domain walls. Current is driven through a line (hereinafter SOT line) having a high spin-orbit interaction and which induces an SOT in the racetrack memory layer. The current in the SOT line induces SOT in a magnetic racetrack memory layer. The SOT moves the domain wall.

Although such racetrack memories function, there may be significant drawbacks. Often, the bits in a racetrack memory are interleaved with domain wall traps. The domain wall traps magnetically stabilize bits in the racetrack memory when the racetrack memory is not being programmed. However, a higher current in the SOT line is typically required to de-pin the domain walls from the domain wall traps (to start the domain wall moving). The use of higher currents is undesirable. Further, control over the domain wall motion is challenging. Removing the current in the SOT line too early may result in the domain wall not moving to the next bit. Removing the current too late may result in the domain wall moving more than one bit. Such precise control over the current pulse is challenging to achieve. As a result, the racetrack memory may be prone to errors. Consequently, a mechanism for improving performance of racetrack memory devices is still desired.

BRIEF DESCRIPTION OF THE DRAWINGS

Various embodiments of the invention are disclosed in the following detailed description and the accompanying drawings.

FIGS. 1A-1D depict an embodiment of a portion of a racetrack memory having improved domain wall speed and performance of such a memory.

DETAILED DESCRIPTION

Figure 2A:
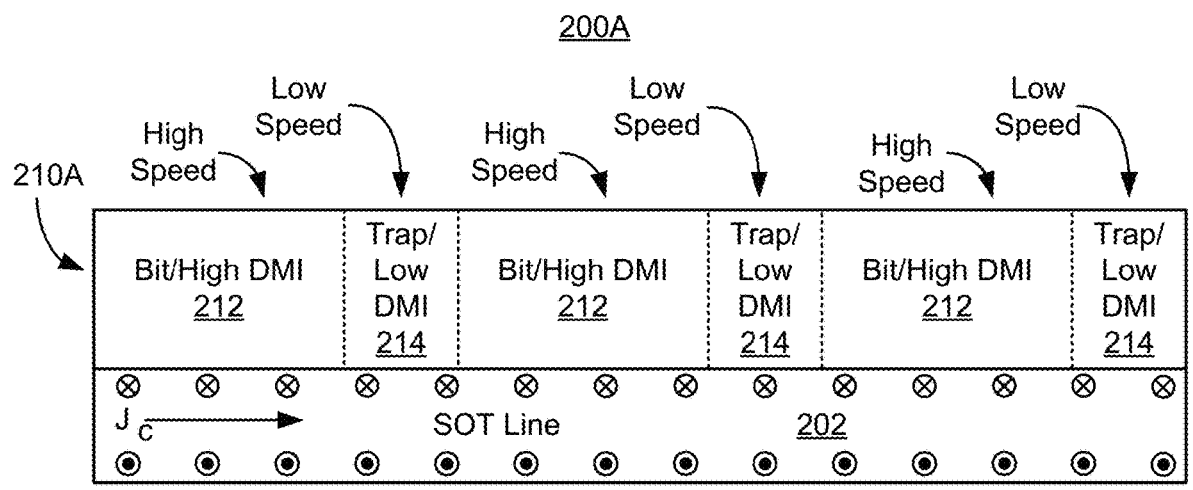
FIGS. 2A-2E depict embodiments of portions of racetrack memories having improved domain wall speed, an embodiment of the DMI for such memories and embodiments of domain wall speeds for some such embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The embodiments are described in the context of particular methods and magnetic memories having certain components. The embodiments are consistent with the use of magnetic memories (or other magnetic devices) having other and/or additional components and/or other features not inconsistent with the description herein. The method and system are also described in the context of current understanding of the spin orbit interaction phenomenon, magnetic anisotropy, and other physical phenomenon. Consequently, one of ordinary skill in the art will readily recognize that theoretical explanations of the behavior of the method and system are made based upon this current understanding of spin orbit torque, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of particular layers. However, one of ordinary skill in the art will readily recognize that additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers described. The terms "comprising," "having," "including," and "containing" are to be construed as open-ended terms (i.e., meaning "including, but not limited to,") unless otherwise noted.

Racetrack memories rely on domain wall motion for programming. The racetrack memory includes a racetrack memory layer divided into bits. Each bit stores the information magnetically, by having its moment oriented in a first direction (a logical "1") or in a second direction opposite to the first direction (a logical "0"). In order to program the racetrack memory, the domain wall between bits is moved. For example, a racetrack memory may have three bits having the following states: a logical "1" state for the first bit, a logical "0" state for the second bit, and a logical "0" state for the third bit. Thus, the magnetic moment of the first bit is in the first direction, the magnetic moment of the second bit is in the second direction and the magnetic moment of the third bit is in the second direction. A domain wall is between the first and second bits. To program the second bit to a logical "1" state, the domain wall between the first bit and the second bit is moved to between the second bit and the third bit. Thus, the three bits will be in the logical "1" state for the first bit (moment in the first direction), the logical "1" stated for the second bit (moment in the first direction), and a logical "0" for the third bit (moment in the second direction).

Some racetrack memories rely on spin-orbit torque (SOT) in order to move domain walls. Such racetrack memories include a racetrack memory layer and a current carrying line (hereinafter SOT line). The racetrack memory layer magnetically stores the information. The SOT line has a high spin-orbit interaction. The high spin-orbit interaction may be due to a bulk effect of the material itself (spin Hall effect), due to interfacial interactions (Rashba effect), some other effect and/or some combination thereof. In such racetrack memories, a current is applied to the SOT line to induce SOT in the racetrack memory layer. The SOT changes the direction of magnetic moments in the racetrack memory layer, which moves the domain wall.

Although such racetrack memories function, there may be significant drawbacks. In order to magnetically stabilize bits in the racetrack memory layer, domain wall traps are often included. While domain wall traps stabilize the state of the bits, the domain wall traps typically require a higher current to de-pin the domain walls from the domain wall traps (i.e. to start the domain wall moving). The use of higher currents is undesirable. Further, control of the final position of the domain wall may be difficult to achieve. For example, the bit size may be on the order of twenty nanometers. Thus, a domain wall travels approximately twenty nanometers when programming a bit. Once moving, domain walls in conventional racetrack memories move at approximately fifty nanometers per nanosecond. Thus, it takes approximately four hundred picoseconds to move a domain wall by one bit. Thus, the current pulse should be initiated and terminate within four hundred picoseconds. Removal of the current too early may result in the domain wall not moving to the next bit. Removing the current too late may result in the domain wall moving more than one bit. Such precise control over the current pulse is challenging to achieve in the time regimes involved. As a result, the racetrack memory may be prone to errors. Although other mechanisms exist to address the speed of the domain wall, such as spin orbit torque overlay layers. However, such mechanisms may still require a higher write current to de-pin the domain walls. As indicated above, a higher write current may be undesirable. Consequently, a mechanism for improving performance of racetrack memory devices is still desired.

A system including a racetrack memory layer is described. The racetrack memory layer includes a plurality of bit locations and a plurality of domain wall traps. The bit locations are interleaved with the domain wall traps. Each of the bit locations has a first domain wall speed. Each of the domain wall traps has a second domain wall speed. The first domain wall speed is greater than the second domain wall speed. The first domain wall speed and the second domain wall speed are due to at least one of a Dzyaloshinskii-Moriya interaction (DMI) variation in the racetrack memory layer, a synthetic antiferromagnetic effect variation in the racetrack memory layer, and a separation distance for the plurality of domain wall traps corresponding to an intrinsic travel distance. The separation distance may be less than one hundred nanometers.

In some embodiments in which the first and second domain wall speeds are due to the DMI variation in the racetrack memory layer, each of the bit locations has a first DMI and each of the domain wall traps has a second DMI. The first DMI is greater than the second DMI. The second DMI may be greater than zero and not more than 0.07 erg/cm'. In some embodiments, the second DMI is at least 0.01 erg/cm$^2$ and not more than 0.05 erg/cm$^2$. In some embodiments, the first DMI is at least 0.05 erg/cm$^2$. In some such embodiments, the first DMI is at least 0.07 erg/cm$^2$. In some embodiments, the system includes a DMI control layer configured such that the bit locations have the first DMI and the domain wall traps have the second DMI. The DMI control layer may include high DMI segments in combination with low DMI segments and/or apertures. The high DMI segments may be adjacent to the bit locations. Each of the high DMI segments may have a DMI of at least 0.07 erg/cm$^2$. The low DMI segments may have a DMI of not more than 0.07 erg/cm$^2$. In some embodiments, the low DMI segments have a DMI of not more than 0.05 erg/cm$^2$.

In some embodiments, the system includes a DMI control layer and a spin orbit torque (SOT) layer. The DMI control layer has a control layer DMI. The SOT line is configured to carry a current for programming the racetrack memory layer. The racetrack memory layer is between the SOT line and the DMI control layer. The SOT line has an SOT DMI. The DMI control layer is configured such that the bit locations have the first DMI and the domain wall traps have the second DMI. The first DMI and the second DMI are based on the SOT DMI and the control layer DMI.

In some embodiments, the racetrack memory layer includes a magnetic material having a bulk or surface DMI corresponding to the first DMI. In such embodiments, the domain wall traps are formed by ion bombardment of the trap material through an aperture in a mask to provide the second DMI from the bulk or surface DMI.

In some embodiments, the first domain wall speed and the second domain wall speed are due to the SAF effect variation in the racetrack memory layer. In such embodiments, the system may further include a nonmagnetic coupling layer and a ferromagnetic layer. The nonmagnetic coupling layer is between the racetrack memory layer and the ferromagnetic layer. The ferromagnetic layer is synthetic antiferromagnetically coupled with the racetrack memory layer. At least the ferromagnetic layer is configured to provide the SAF effect variation in the racetrack memory layer.

In some embodiments, the first domain wall speed and the second domain wall speed are due to the separation distance for the plurality of domain wall traps corresponding to the intrinsic travel distance. The separation distance may be at least twenty nanometers and not exceeding one hundred nanometers.

In some embodiments, a system including a racetrack memory layer and an SOT line is described. The racetrack memory layer includes bit locations and domain wall traps. The bit locations are interleaved with the domain wall traps. Each bit location has a first domain wall speed, while each domain wall trap has a second domain wall speed. The first domain wall speed is greater than the second domain wall speed. The first domain wall speed and the second domain wall speed are due to at least one of a DMI variation in the racetrack memory layer, SAF effect variation in the racetrack memory layer, and a separation distance for the domain wall traps corresponding to an intrinsic travel distance. The separation distance may be at least twenty nanometers and not more than one hundred nanometers. For the first and second domain wall speeds being due to the DMI variation in the racetrack memory layer, each bit location has a first DMI and each domain wall trap has a second DMI. The first DMI is greater than the second DMI. The second DMI may be greater than zero and not more than 0.05. For the first and second domain wall speeds being due to the SAF effect variation, the system further includes a ferromagnetic layer and nonmagnetic coupling layer between the racetrack memory layer and the ferromagnetic layer. The ferromagnetic layer is synthetic antiferromagnetically coupled with the racetrack memory layer. At least the ferromagnetic layer is configured to provide the SAF effect variation in the racetrack memory layer. The SOT line is configured to carry a current for programming the racetrack memory layer.

In some embodiments, a method for providing a magnetic device is described. The method includes providing a racetrack memory layer. Providing the racetrack memory layer includes providing bit locations and providing domain wall traps. The bit locations are interleaved with the plurality of domain wall traps. Each bit location has a first domain wall speed. Each of the domain wall traps has a second domain wall speed. The first domain wall speed is greater than the second domain wall speed. The first domain wall speed and the second domain wall speed are due to at least one of a DMI variation in the racetrack memory layer, a SAF effect variation in the racetrack memory layer, and a separation distance for the domain wall traps corresponding to an intrinsic travel distance. The separation distance may be at least twenty nanometers and not more than one hundred nanometers.

In some embodiments, in which the first and second domain wall speeds are due to the DMI variation in the racetrack memory layer, providing the racetrack memory layer further includes configuring each of the bit locations to have a first DMI and each of the domain wall traps to have a second DMI. The first DMI is greater than the second DMI. The second DMI may be greater than 0.01 and not more than 0.05. In some embodiments, configuring the bit locations and domain wall traps further includes providing a DMI control layer. The DMI control layer is configured such that the bit locations have the first DMI and the domain wall traps have the second DMI.

In some embodiments, providing the DMI control layer further includes providing a high DMI segments adjacent to the bit locations. Each of the high DMI segments may have a DMI of at least 0.07 erg/cm². Fabricating the DMI control layer also includes providing at least one of apertures and low DMI segments. Each low DMI segments may have a DMI of not more than 0.07 erg/cm². In some embodiments, configuring the bit locations and the domain wall traps includes providing an SOT line and providing a DMI control layer. The SOT line is configured to carry a current for programming the racetrack memory layer. The racetrack memory layer is between the SOT line and the DMI control layer. The SOT line may have an SOT DMI. In such embodiments, the DMI control layer is configured such that the bit locations have the first DMI and the domain wall traps have the second DMI. The first DMI and the second DMI are based on the SOT DMI and a control layer DMI.

In some embodiments, providing the racetrack memory layer further includes providing a magnetic material having a bulk or surface DMI corresponding to the first DMI and ion bombarding a portion of the magnetic material corresponding to the domain wall traps. Thus, the second DMI may be provided from the bulk or surface DMI.

In some embodiments, the first domain wall speed and the second domain wall speed are due to the SAF effect variation in the racetrack memory layer. In such embodiments, the method further includes providing a nonmagnetic coupling layer and providing a ferromagnetic layer such that the nonmagnetic coupling layer is between the ferromagnetic layer and the racetrack memory layer. The ferromagnetic layer is synthetic antiferromagnetically coupled with the racetrack memory layer. At least the ferromagnetic layer is configured to provide the SAF effect variation in the racetrack memory layer.

In some embodiments, the first and second domain wall speeds are due to the separation distance for the domain wall traps corresponding to the intrinsic travel distance. The intrinsic travel distance is the distance which a domain wall travels before gradually slowing down due to magnetization tilting in the domain wall to be along the spin orbit torque (thus Neel to Bloch wall conversion). The separation distance may be at least twenty nanometers and not exceeding one hundred nanometers.

FIGS. 1A-1D depict an embodiment of a portion of a racetrack memory 100 having improved domain wall speed and performance of such a memory. More specifically, FIG. 1A depicts racetrack memory 100. For clarity, not all of racetrack memory 100 is depicted and FIG. 1A is not to scale. FIGS. 1B, 1C, and 1D are graphs 150, 160, and 170 depicting characteristics of racetrack memory 100.

Racetrack memory 100 includes a racetrack memory layer 110 and a spin-orbit torque (SOT) line 102. SOT line 102 is a conductive line having a high spin-orbit interaction. Thus, in some embodiments, SOT line 102 has a high spin Hall angle. Current driven through SOT line 102 induces a SOT in racetrack memory layer 110. For example, FIG. 1A depicts a current, Jc, sufficient to move the domain wall along the racetrack. Charge carriers having spins oriented into the page drift to the top of SOT line 102, while charge carriers having spins oriented out of the page drift to the bottom of SOT line 102 for the current $J_c$ shown. For a current driven in the opposite direction, the charge carriers would have opposite drift directions. The charge carriers at the top of SOT line 102 exert a torque on magnetization of racetrack memory layer 110. This torque is responsible for moving the domain wall. SOT line 102 is desired to be sufficiently thick to induce the requisite spin polarization within SOT line 102 for the desired SOT at racetrack memory layer 110.

The materials used in SOT line 102 have a high spin orbit interaction. For example, SOT line 102 may include or consist of alloys of two or more of W, Pt, Tb, Bi, Hf, Zr, Ag, Au, and Si (e.g. WHf); alloys of two or more of W, Pt, Tb, Bi, Hf, Zr, Ag, Au, and Si with some oxidation at the interface; multilayers including one or more of W, Pt, Tb, Bi, Hf, Zr, Ag, Au, and Si (e.g. one or more repeats of a bilayer of Au/Si); and/or topological insulators (e.g. BiTe, BiSe, TlBiTe, TlBiSe, SbTeS, BiTeS, BiTeSe, GeSbTe, SnSbTe, GeBiTe, SnBiTe, BiSb, FeGeTe, and/or BiSbSe). Other and/or additional materials may be used for SOT line 102. In some embodiments, another component may be used in addition to or in lieu of SOT line 102 to move the domain walls in racetrack memory layer 110. In some embodiments, another component may be used in addition to or in lieu of SOT line 102 to move the domain walls in racetrack memory layer 110.

Racetrack memory layer 110 is magnetic and stores data magnetically. In some embodiments, racetrack memory layer 110 is a single layer. In other embodiments, racetrack memory layer 100 includes one or more layers and/or substructures. Racetrack memory layer 110 may have a high perpendicular magnetic anisotropy (PMA). In some embodiments, the PMA energy of racetrack memory layer 110 is greater than the out-of-plane demagnetization energy of racetrack memory layer 110. Thus, the magnetic moments of racetrack memory layer 110 may be stable substantially perpendicular to plane. Racetrack memory 100 shown in FIG. 1A is one such an embodiment. To provide a high PMA, racetrack memory layer 110 may include or consist of one or more of interfacial PMA material(s) (e.g. Co, CoFe, Fe, CoFeB, CoFeBe, CoFeC, CoFeX, CoFeBX, CoFeBeX, CoFeCX, FeX, and/or CoX where X is selected from one or more of Zr, Nb, Mo, Mg, Cr, Ta, Ti, W, and V), bulk PMA material(s) (e.g. $L1_0$ materials such as FePt, FePd and/or CoPt), $L1_2$ materials (e.g. $Ni_3Fe$), and/or hexagonal close-packed (HCP) material(s) (e.g. a CoPt alloy, a Co/Pt multilayer, a Co/Pd multilayer and/or alloy, and/or a Co/Ni multilayer and/or alloy). For simplicity, the specific stoichiometries of various material(s) are not indicated and/or can vary from that indicated.

Racetrack memory layer 110 includes bit locations 112 (also termed "bits" herein) interleaved with domain wall traps 114 (also termed "traps" herein). Bit locations 112 store data, while traps 114 reside between bit locations. Traps 114 aid in stabilizing the location of domain walls when racetrack memory 100 is quiescent (i.e. not being programmed). The magnetic moment (shown as unlabeled arrows) in each bit 112 is stable perpendicular to plane in the embodiment shown. In the state shown in FIG. 1A, a domain wall resides in middle trap 114 because adjoining bit locations 112 have magnetic moments oriented in opposing directions.

Racetrack memory 100 is configured such that each bit location 112 has a first domain wall speed, while each domain wall trap 114 has a second domain wall speed. The first domain wall speed is greater than the second domain wall speed. Consequently, a domain wall moves faster through a bit location 112 than through a trap 114. The difference in domain wall speeds may be due to intrinsic pinning of the domain wall. Intrinsic pinning slows or terminates movement of the domain wall by phenomena excluding extrinsic effects (e.g. pinning by defects, notches and/or changes in material). In some embodiments, the pinning may be accomplished by extrinsic effects or a combination of extrinsic and intrinsic effects. Racetrack memory layer 110 may be configured such that the first and second speeds are characteristics of bit locations 112 and traps 114. In some embodiments, additional structures (not shown in FIG. 1A) are used in addition to or in lieu of configuration racetrack memory layer 110 in order to provide the first and second speeds in the bit location s 112 and traps 114, respectively.

The difference in the domain wall speeds in bit locations 112 versus the domain wall speeds in domain wall traps 114 may be due to the nature of the domain wall. For example, the characteristics of a domain wall may change based on the magnitude of the current in SOT line 102. For lower currents driven through an SOT line, the domain wall in a magnetic layer (e.g. a racetrack memory layer) may move rapidly. As the current through the SOT line increases, the domain wall speed increases. However, at higher currents through the SOT line, the speed of the domain wall reaches a maximum and then decreases. In some cases, the decrease in domain wall speed is sufficient to bring the domain wall to a stop after traveling on the order of twenty through one hundred nanometers.

The effect of current in SOT line 102 on the domain wall speed may be seen in FIGS. 1B-1D. Graph 150 of FIG. 1B depicts the domain wall speed (Vdw) versus current ($J_c$) in SOT line 102 for various damping coefficients (a) of the magnetic material(s) that may be used in racetrack memory layer 110. For simplicity, units are not provided for the current and speed. Although the specific location of the maximum in domain wall speed and the current at which the domain wall speed is at or near zero varies for different damping coefficients, the general shapes of the curves are analogous. Thus, for higher currents in the SOT line, the domain wall speed falls off and may go to or near zero.

FIG. 1C is graph 160 depicting the position of the domain wall (DWposition) versus time for various currents ($J_c$) through SOT line 102 and a particular damping coefficient for the magnetic material(s) used in racetrack memory layer 110. For simplicity, units are not provided for the current and speed. The slopes of the curves shown in graph 160 are the domain wall speed for the parameters selected. For higher currents (e.g. $J_c$ is 7, 8, or 9), the position of the domain wall initially changes relatively quickly (i.e. the domain wall speed is nonzero and large). However, the domain wall significantly slows or stops, resulting in little to no change in the domain wall position for larger currents through the SOT line.

The change in domain wall speed may be understood based on the type of domain wall that may be present in a magnetic layer such as a racetrack memory layer. Neel domain walls move relatively freely when subjected to SOT. In contrast, Bloch domain walls move very slowly (or are at or near a standstill) when subjected to SOT. Thus, the change in speed versus current in the SOT line indicated in FIGS. 1B-1C may be viewed as a transition from Neel domain walls to Bloch domain walls. Similarly, FIG. 1D includes graph 170 depicting magnetic moment versus current in a SOT line. As current increases in graph 170, the plot tilts away from the dotted line. This indicates a transition from a Neel domain wall to (or closer to) a Bloch domain wall at higher currents. This feature also indicates that the speed of the domain wall may decrease below that the characteristic speed for a Neel domain wall, but still be nonzero. Stated differently, the domain wall speed starts to decrease, and goes to or near zero for a Bloch domain wall. Racetrack memory 100 may take advantage of this transition between Neel and Bloch walls.

Racetrack memory layer 110 thus includes bit locations 112 in which domain walls may travel in a manner analogous to Neel domain walls when under the influence of SOT. In contrast, domain walls in traps 114 may travel in a manner more analogous to Bloch domain walls when under the influence of SOT. The differences in domain wall speeds (and/or domain wall type) in bit locations 112 and traps 114 may be due to one or more factors. For example, the domain wall speed in bit locations 112 being greater than a domain wall speed in traps 114 may be due to one or more of: variations in the Dzyaloshinskii-Moriya interaction (hereinafter DMI) of racetrack memory layer 110, variations in a synthetic antiferromagnetic (SAF) effect (i.e. variations in the Ruderman-Kittel-Kasuya-Yosida (RKKY) coupling) at racetrack memory layer 110, and configuring a separation distance for domain wall traps 114 corresponding to an intrinsic travel distance, where the separation distance is less than one hundred nanometers. In some embodiments, these factors may be combined with each other and/or other mechanisms for changing the domain wall speed within racetrack memory layer 110.

In operation, a write current is driven through SOT line 102 to program one or more bit locations 112. Because of the presence of the write current in SOT line 102, SOT is exerted on racetrack memory layer 102. The domain wall in trap 114 (the middle trap of FIG. 1A) is de-pinned and begins to move. Because of the configuration of racetrack memory 100 the domain wall moves relatively rapidly through the adjoining bit 112 while the write current is applied to SOT line 102. In other words, the domain walls act as Neel walls in bit location 112. However, the domain wall travels significantly more slowly in domain wall trap 114 even though a write current is still driven through SOT line 102. Thus, the domain walls are more analogous to Bloch walls in domain wall trap 114. In some embodiments, the domain wall starts to slow as it approaches trap 114. In some embodiments, the domain wall slows after entering trap 114. The current in SOT line 102 may be removed and the domain wall stops within trap 114. If the domain wall is desired to move across multiple bits, then another current pulse may be applied to SOT line 102 or the current can remain on for an amount of time corresponding to the appropriate trap 114 being reached by the domain wall.

Thus, racetrack memory 100 is configured to have a varying domain wall speed. For example, the domain wall speed may be relatively high (e.g. may be at least 40 m/s-200 m/s) in bit locations 112, but lower (e.g. as low as 5 m/s-30 m/s or less) in traps 114. Because the domain wall moves rapidly through bit locations 112, programming may be accomplished relatively quickly. Because the domain wall moves more slowly through traps 114, more time may be taken in removing the current through SOT line 102 without driving the domain wall into the next bit location 112. Thus, the timing for programming of racetrack memory 100 may be less tightly controlled. Racetrack memory 100 is, therefore, less prone to write errors. Because of the nature of the change in speeds (e.g. intrinsic pinning and/or differences between Neel and Bloch type domain walls), the domain walls may be more readily de-pinned from traps 114. Stated differently, a high current through SOT line 102 is not required to start motion of the domain walls in traps 114. Thus, performance, speed and accuracy of racetrack memory 100 may be improved.

Figure 2B:
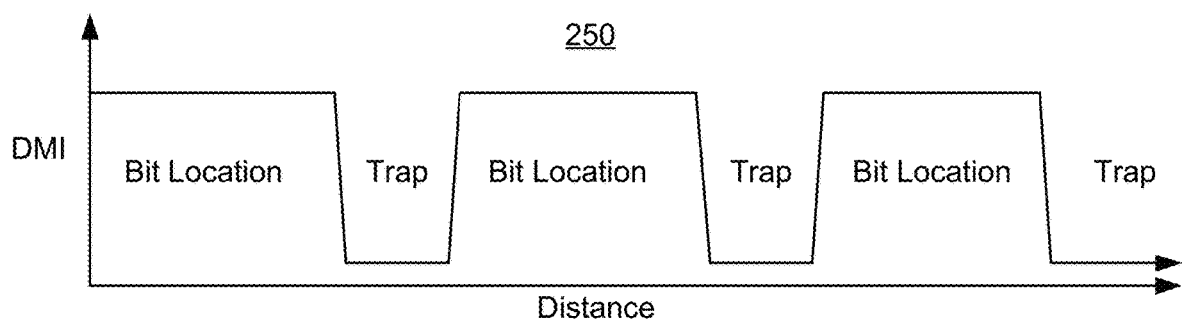
Figure 2C:
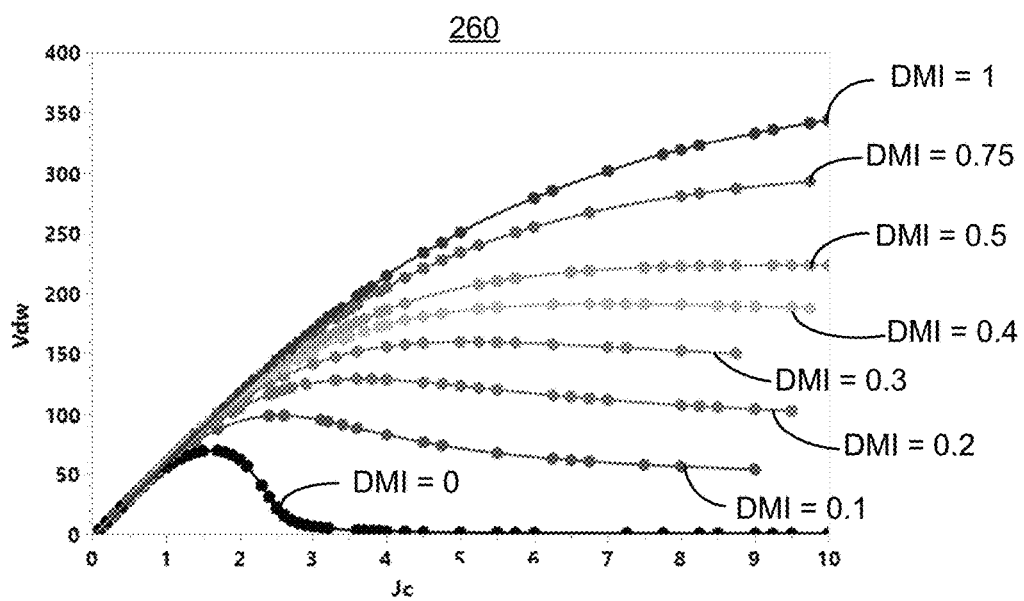
Figure 2D:
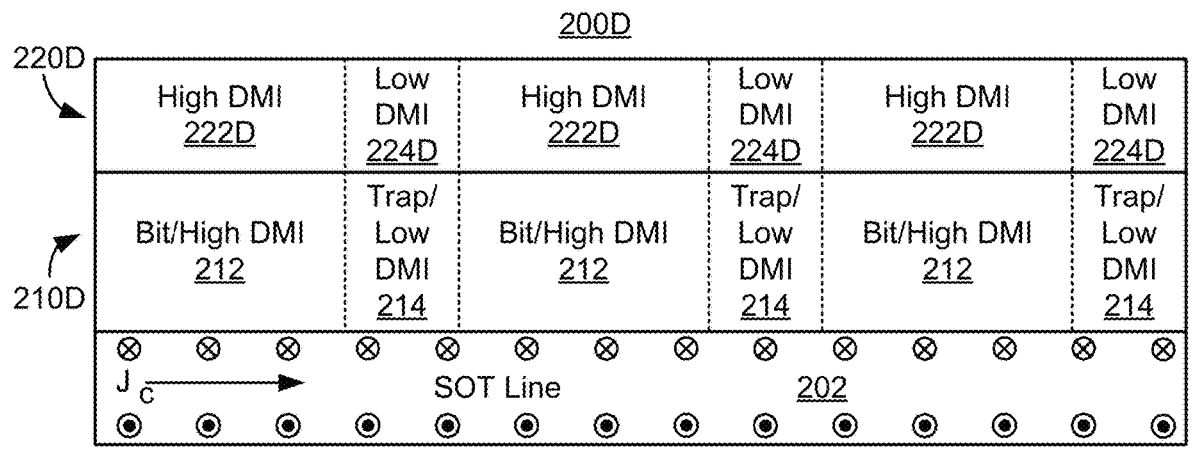
Figure 2E:
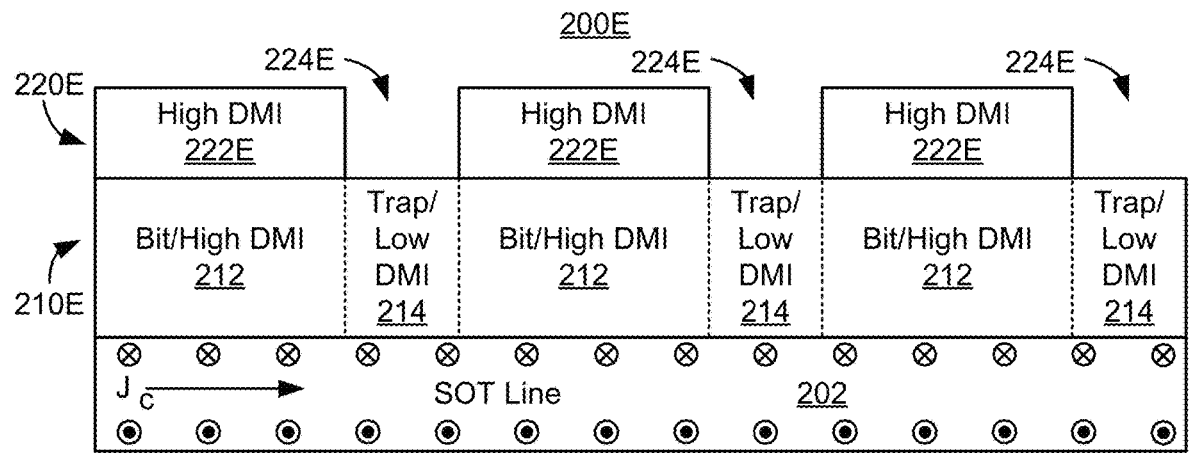

FIGS. 2A-2E depict an embodiment of a portion of racetrack memories 200A, 200D and 200E (collectively, racetrack memories 200) having improved domain wall speed and performance of such a memory. More specifically, FIGS. 2A, 2D and 2E depict embodiments of racetrack memories 200A, 200D, and 200E, respectively. For clarity, not all of racetrack memories 200A, 200D, and 200E are depicted and FIGS. 2A, 2D and 2E are not to scale. FIGS. 2B and 2C are graphs 250 and 260, respectively depicting characteristics of racetrack memory 200.

Racetrack memory 200A includes SOT line 202 and racetrack memory layer 210A that are analogous to SOT line 102 and racetrack memory layer 110, respectively. Thus, analogous material(s) may be used for racetrack memory layer 210A and SOT line 202 as for racetrack memory layer 110 and SOT line 102, respectively. Further, the functions of racetrack memory layer 210A and SOT line 202 are analogous to the functions of racetrack memory layer 110 and SOT line 102, respectively.

Racetrack memory layer 210A includes bit locations 212 and domain wall traps 214. Bit locations 212 and domain wall traps 214 are analogous to bit locations 112 and domain wall traps 114, respectively. Thus, domain walls have a first domain wall speed in a bit location 212 and a second domain wall speed in a trap 214. The second domain wall speed is less than the first domain wall speed.

In racetrack memory 200A, the variation in domain wall speed is due to modulation in DMI for racetrack memory layer 210A. In particular, bit location 212 has a first DMI, while trap 214 has a second DMI. The first DMI is greater than the second DMI. FIG. 2B is a graph 250 depicting an embodiment of DMI versus position for racetrack memory layer 210A. DMI is higher in positions corresponding to bit locations 212, while DMI is lower in positions corresponding to traps 214. The second DMI may be not more than 0.1 erg/cm$^2$. In some embodiments, the second DMI may be greater than zero and not more than 0.07 erg/cm$^2$. In some embodiments, the second DMI is at least 0.01 erg/cm$^2$ and not more than 0.05 erg/cm$^2$. In some embodiments, the first DMI is at least 0.05 erg/cm$^2$. In some such embodiments, the first DMI is at least 0.07 erg/cm$^2$. In some embodiments, the first DMI is greater than 0.1 erg/cm$^2$. In some embodiments, the first DMI is greater than 0.2 erg/cm$^2$.

Variations in DMI may correspond to modulations in the domain wall speed. Variations in DMI may also determine whether domain walls behave in a manner analogous to a Neel domain wall or in a manner analogous to a Bloch wall. FIG. 2C is a graph 260 depicting an embodiment of domain wall speed (Vdw) versus current ($J_c$) in SOT line 202 for various DMIs. As indicated in graph 260, for lower DMI (e.g. DMI of less than 0.1) the domain wall speed initially increases with increasing current in a manner analogous to higher DMI. However, for higher currents, domain wall speed decreases toward zero. In contrast, for higher DMI (e.g. greater than the second DMI, greater than 0.07 erg/cm$^2$, greater than 0.1 erg/cm$^2$, and in some embodiments greater than 0.2 erg/cm$^2$), the domain wall speed either continues to increase or decreases less rapidly with increasing current. Consequently, by modulating the DMI in racetrack memory layer 210A, the domain wall speed may be higher in bit locations 212, lower in traps 214, but still able to be de-pinned from traps 214 at relatively low current.

The DMI of racetrack memory layer 210A may be modulated using a variety of mechanisms. In some embodiments, racetrack memory layer 210A may be processed to vary the DMI. For example, a material having a larger bulk or surface DMI may be subjected to one or more ion bombardment treatments at traps 214 to decrease the DMI in and/or around traps 214. Examples of ion bombardment include one or more of He+, B+, and/or similar light elements with characteristic bombardment energies from 1 keV to 5000 keV range with different durations of bombardment. In some embodiments, additional structures (not shown in FIG. 2A) may be used to modulate the DMI of racetrack memory layer 210A. Such additional structures may be coupled with racetrack memory layer 210A such that the DMI of racetrack memory layer 210A is modified. For example, the interface and structural symmetry of a particular structure can affect the DMI of an adjoining structure. Some such embodiments are discussed with respect to FIGS. 2C and 2D.

In some embodiments, SOT line 202 affects the DMI of racetrack memory layer 210A. SOT line 202 is desired to be sufficiently thick to induce the desired spin polarization within SOT line 202. The desired spin polarization in SOT line 202 results in the desired SOT at racetrack memory layer 210. However, SOT line 202 may be formed of materials that affect the DMI of racetrack memory layer 210A. In such embodiments, processing of racetrack memory layer 210A and/or other structures affecting the DMI of racetrack memory layer 210A are configured to account for the DMI induced by SOT line 202. For example, DMI can be negative (e.g. for Hf) or positive (e.g. for certain thicknesses of W). Hf and/or W may be used in SOT line 202. In some embodiments, SOT line 202 shares an interface with (or is in proximity to) racetrack memory layer 210A. As a result, SOT line 202 may affect the DMI of racetrack memory layer 210A. Racetrack memory layer 210A and other structures (not shown in FIG. 2A) may be configured such that the DMI of racetrack memory layer 210A varies as desired. Thus, SOT provided via SOT line 202 and DMI at racetrack memory layer 210 may be tuned separately to optimize both SOT and DMI modulation.

Referring to FIGS. 2A-2C, in operation, a write current (e.g. a current pulse) is driven in SOT line 202. This current pulse results in the spin polarization in SOT line 202, which generates SOT in racetrack memory layer 210A. Although a domain wall may exist in trap 214, as current increases in SOT line 202, the domain wall in trap 214 is readily de-pinned and moves with increasing velocity. This is indicated by the behavior near zero current for the curves in graph 260 of FIG. 2C. As the pulse is applied, the domain wall moves out of trap 214 and rapidly crosses high DMI bit location 212. The domain wall moves into the next trap 214, which has reduced DMI. As a result, the speed of the domain wall may be dramatically decreased. This may be seen by the curves for DMI=0 and DMI=0.1 in graph 260. The current may be removed (e.g. the current pulse terminates) while the domain wall is in trap 214. Thus, the bit has been programmed. If the domain wall is desired to move across multiple bits, then another current pulse may be applied to SOT line 202 or the current can remain on for an amount of time corresponding to the appropriate trap 214 being reached by the domain wall.

Racetrack memory 200A may share the benefits of racetrack memory 100. Because the domain wall moves rapidly through bit locations 212, programming may be accomplished relatively quickly. Because the domain wall moves more slowly through traps 214, more time may be taken in removing the current through SOT line 202 without driving the domain wall into the next bit location 212. Thus, the timing for programming of racetrack memory 200A may be less tightly controlled. Racetrack memory 200A may also be less prone to write errors. Further, because of the nature of the change in speeds, the domain walls may be more readily de-pinned from traps 214. Stated differently, a high current through SOT line 102 is not required to start motion of the domain walls in traps 214. Instead, the domain walls have a relatively high initial speed. Thus, performance, speed and accuracy of racetrack memory 200A may be improved.

FIG. 2D depicts an embodiment of a portion of racetrack memory 200D. Racetrack memory 200D includes SOT line 202 and racetrack memory layer 210D that are analogous to SOT lines 102 and 202 and racetrack memory layers 110 and 210A, respectively. Thus, analogous material(s) may be used for racetrack memory layer 210D and SOT line 202 as for racetrack memory layer 110 and SOT line 102, respectively. Further, the functions of racetrack memory layer 210D and SOT line 202 are analogous to the functions of racetrack memory layers 110 and 210A and SOT lines 102 and 202, respectively.

Racetrack memory 200D is analogous to racetrack memory 200A in that the DMI of racetrack memory layer 210D is modulated. Racetrack memory layer 210D includes bit locations 212 and domain wall traps 214 that are analogous to bit locations 212 and domain wall traps 214, respectively, of racetrack memory layer 210A. Thus, domain walls have a first domain wall speed in bit locations 212 and a second domain wall speed in traps 214 of racetrack memory layer 210D. The second domain wall speed is less than the first domain wall speed. The first DMI of bit locations 212 is greater than the second DMI of bit locations 214. Thus, FIGS. 2B and 2C also apply to racetrack memory layer 200D. In some embodiments, the first DMI and the second DMI for racetrack memory layer 210D are in the range described above for racetrack memory layer 210A.

Racetrack memory 200D also includes DMI control layer 220D. Although shown as a single layer, in some embodiments DMI control layer 220D may be a multilayer and/or include multiple substructures. DMI control layer 220D is coupled to racetrack memory layer 210D and is used to modulate the DMI of racetrack memory layer 210D. In some embodiments, DMI control layer 220D is used in addition to DMI modulation of the materials used in racetrack memory layer 210D (e.g. DMI control layer combined with modulation by ion implantation of racetrack memory layer 210D). In some embodiments, DMI control layer 220D is used in lieu of DMI modulation of the materials used in racetrack memory layer 210D. In embodiments in which SOT line 202 affects the DMI of racetrack memory layer 210D, DMI control layer 220D may also be configured to account for the DMI of SOT line 202. Stated differently, the DMI of racetrack memory layer 210D may be based on the DMI of DMI control layer 220D and the DMI of SOT line 202. Thus, the desired DMI modulation may be achieved in racetrack memory layer 210D. For example, DMI control layer 220D may be used to increase, enhance, offset, or reduce DMI due to SOT line 202 in traps 214 and/or bit locations 212. DMI control layer 220D is configured such that bit location 212 have the first DMI and traps 214 have the second DMI. In the embodiment shown, DMI control layer 220D includes high DMI segments 222D in combination with low DMI segments 224D. High DMI segments 222D are adjacent to bit locations 212, while low DMI segments 224D are adjacent to traps 214. In some embodiments, high DMI segments 222D adjoin (i.e. share an interface with) bit locations 212. Similarly, low DMI segments 224D may adjoin (i.e. share an interface with) traps 214. Thus, high DMI segments 222D may modify the DMI of bit locations 212, while low DMI segments 224D may modify the DMI of traps 214.

Each high DMI segment 222D may have a DMI of at least 0.07 erg/cm$^2$. In some embodiments, each high DMI segment 222D has a DMI of at least 0.1 erg/cm$^2$. In some embodiments, each high DMI segment 222D has a DMI of at least 0.2 erg/cm$^2$. Each low DMI segment 224D may have a DMI of not more than 0.07 erg/cm$^2$. In some embodiments, each low DMI segment 224D has a DMI of not more than 0.05 erg/cm$^2$. In some embodiments, DMI control layer 220 may include or consist of alloys of two or more of W, Pt, Tb, Bi, Hf, Zr, Ag, Au, and Si (e.g. WHf); alloys of two or more of W, Pt, Tb, Bi, Hf, Zr, Ag, Au, and Si with some oxidation at the interface; multilayers including one or more of W, Pt, Tb, Bi, Hf, Zr, Ag, Au, and Si (e.g. one or more repeats of a bilayer of Au/Si); and/or topological insulators (e.g. BiTe, BiSe, TlBiTe, TlBiSe, SbTeS, BiTeS, BiTeSe, GeSbTe, SnSbTe, GeBiTe, SnBiTe, BiSb, FeGeTe and/or BiSbSe). Other and/or additional materials may be used for DMI control layer 220D.

In some embodiments, the modulation of the DMI in DMI control layer 220D is provided by processing DMI control layer 220D. For example, one or more ion implantation treatments that reduce DMI may be performed for low DMI segments 224D. In some embodiments, DMI control layer 220D is thinner in for low DMI segments 224D than for high DMI segments 222D. For example, layer(s) for DMI control layer 220D may be deposited, a mask covering high DMI segments 222D and exposing low DMI segments 224D may be provided, and the layer etched. Thickness modulation may be combined with ion implantation in some cases. Other and/or additional mechanisms may be used to vary the DMI in DMI control layer 220D. Thus, DMI control layer 220D may be used to provide the desired DMI in racetrack memory layer 210D. Stated differently, DMI control layer 220D may be utilized to configure the DMI of racetrack memory layer 210D.

Racetrack memory 200D may share the benefits of racetrack memories 100 and/or 200A. Because the domain wall moves rapidly through bit locations 212, programming may be accomplished relatively quickly. Because the domain wall moves more slowly through traps 214, the timing for programming of racetrack memory 200D may be less tightly controlled. Racetrack memory 200D may also be less prone to write errors. Further, because of the nature of the change in speeds, the domain walls may be more readily de-pinned from traps 214. Stated differently, a high current through SOT line 202 is not required to start motion of the domain walls in traps 214. Instead, the domain walls have a relatively high initial speed. Thus, performance, speed and accuracy of racetrack memory 200D may be improved.

FIG. 2E depicts an embodiment of a portion of racetrack memory 200E. Racetrack memory 200E includes SOT line 202 and racetrack memory layer 210E that are analogous to SOT lines 102 and 202 and racetrack memory layers 110, 210A and 210D, respectively. Thus, analogous material(s) may be used for racetrack memory layer 210E and SOT line 202 as for racetrack memory layer 110 and SOT line 102, respectively. Further, the functions of racetrack memory layer 210E and SOT line 202 are analogous to the functions of racetrack memory layers 110, 210A and 210D and SOT lines 102 and 202, respectively.

Racetrack memory 200E is analogous to racetrack memories 200A and 200D in that the DMI of racetrack memory layer 210E is modulated. Further, racetrack memory 200E includes DMI control layer 220E that is analogous to DMI control layer 220D of racetrack memory 200D. In particular, DMI control layer 220E is used to configure the DMI of racetrack memory layer 210E in a manner analogous to DMI control layer 220D. However, DMI control layer 220E includes apertures rather than low DMI segments 222D.

Racetrack memory layer 210E includes bit locations 212 and domain wall traps 214 that are analogous to bit locations 212 and domain wall traps 214, respectively, of racetrack memory layers 210A and/or 210D. Thus, domain walls have a first domain wall speed in bit locations 212 and a second domain wall speed in traps 214 of racetrack memory layer 210E. The second domain wall speed is less than the first domain wall speed. Further, the first DMI of bit locations 212 is greater than the second DMI of bit locations 214. Thus, FIGS. 2B and 2C also apply to racetrack memory layer 200E. In some embodiments, the first DMI and the second DMI for racetrack memory layer 210E are in the range described above for racetrack memory layer 210A.

DMI control layer 220E includes high DMI segments 222E in combination with apertures 224E. Although termed apertures, in some embodiments, a thin layer of the material(s) for DMI control layer 220E may be present in apertures 224E. High DMI segments 222E are adjacent to bit locations 212, while apertures 224E are adjacent to traps 214. In some embodiments, high DMI segments 222E adjoin (i.e. share an interface with) bit locations 212. Thus, high DMI segments 222E may modify the DMI of bit locations 212. High DMI segments 222E may have a DMI in the ranges described above with respect to racetrack memory 200D.

Racetrack memory 200E may share the benefits of racetrack memories 100, 200A and/or 200D. Because of the engineered speeds of the domain walls in racetrack memory layer 210E, domain walls move rapidly through bit locations 212 and slowly through traps. Thus, programming may be accomplished relatively quickly, the timing for programming of racetrack memory 200E may be less tightly controlled, racetrack memory 200E may be less prone to write errors, and the domain walls may be more readily de-pinned from traps 214. Thus, performance, speed and accuracy of racetrack memory 200E may be improved.

Figure 3:
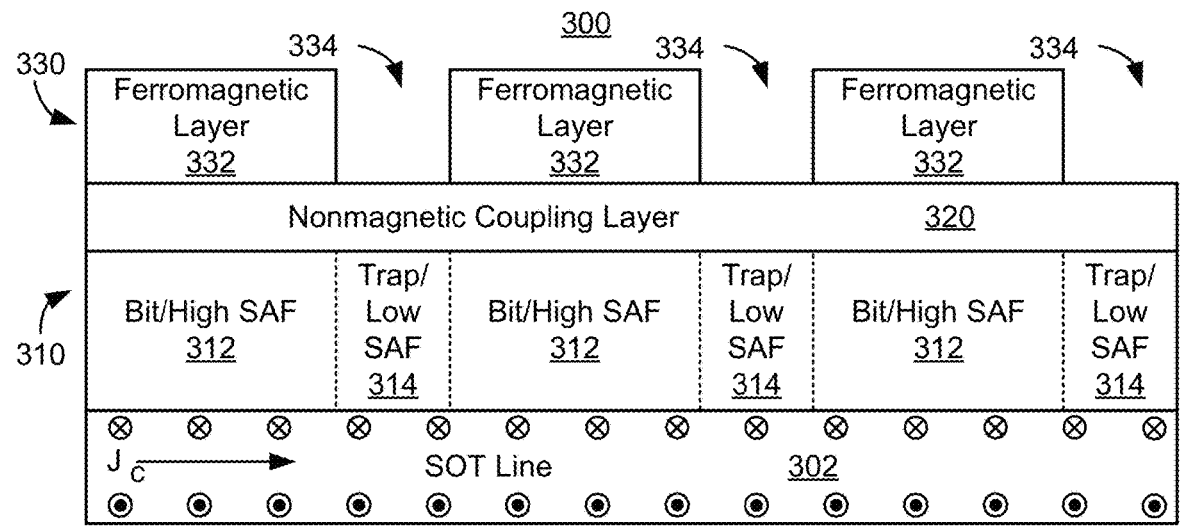
FIG. 3 depicts an embodiment of a portion of a racetrack memory having improved domain wall speed.

FIG. 3 depicts an embodiment of a portion of a racetrack memory 300 having improved domain wall speed and performance of such a memory. For clarity, not all of racetrack memory 300 is depicted and FIG. 3 is not to scale. Racetrack memory 300 is analogous to racetrack memory 100 and racetrack memories 200A, 200D and 200E. Racetrack memory 300 includes SOT line 302 and racetrack memory layer 310 that are analogous to SOT lines 102 and 202 and racetrack memory layers 110, 210A, 210D and 210E, respectively. Thus, analogous material(s) may be used for racetrack memory layer 310 and SOT line 302 as for racetrack memory layers 110, 210A, 210D and 210E and SOT lines 102 and 202, respectively. Further, the functions of racetrack memory layer 310 and SOT line 302 are analogous to the functions of racetrack memory layer 110, 210A, 210D and 210E and SOT lines 102 and 202, respectively.

Racetrack memory layer 310 includes bit locations 312 and domain wall traps 314. Bit locations 312 and domain wall traps 314 are analogous to bit locations 112 and 212 and domain wall traps 114 and 214, respectively. Thus, domain walls have a first domain wall speed in bit locations 312 and a second domain wall speed in traps 314. The second domain wall speed is less than the first domain wall speed.

Racetrack memory 300 also includes nonmagnetic coupling layer 320 and ferromagnetic layer 330. Ferromagnetic layer 330 has magnetization substantially perpendicular to the plane. In other embodiments, the magnetization may be substantially in the plane of the layer 330. Ferromagnetic layer 330 is coupled with racetrack memory layer 310 via a Ruderman-Kittel-Kasuya-Yosida (RKKY) coupling. Stated differently, ferromagnetic layer 330 is magnetically coupled with racetrack memory layer 310 through a synthetic antiferromagnetic (SAF) effect. In racetrack memory 300, the difference in domain wall speed is due to modulation in the SAF effect for racetrack memory layer 310. The SAF effect results in an anisotropy in racetrack memory layer 310 that is analogous to DMI. A larger SAF effect results in higher domain wall speeds. Thus, the SAF effect due to ferromagnetic layer 330 is higher at bit locations 312 and lower at traps 314. In the embodiment shown, this modulation in the SAF effect for racetrack memory layer 310 is provided by modulations in thickness of ferromagnetic layer 332. In the embodiment shown in FIG. 3, ferromagnetic layer 330 includes ferromagnetic portions 332 and apertures 324. In some embodiments, ferromagnetic layer 330 may not be completely removed in the location of apertures 324. For example, ferromagnetic layer 330 may simply be thinned in the region of apertures 324. In some embodiments, nonmagnetic coupling layer 320 may be thinned in the region below apertures 334. In some embodiments, nonmagnetic coupling layer 320 may have apertures aligned with apertures 334.

In operation, a write current (e.g. a current pulse) is driven in SOT line 302. This current pulse results in the spin polarization in SOT line 302, which generates SOT in racetrack memory layer 310. Because the SAF effect is analogous to DMI with respect to domain wall motion, the domain wall in trap 314 is readily de-pinned and moves with increasing velocity as current increases in SOT line 302. As the current is applied, the domain wall moves out of trap 314 and rapidly crosses high SAF effect bit location 312. The domain wall moves into the next trap 314, which has reduced SAF effect. As a result, the speed of the domain wall may be dramatically decreased. The current may be removed while the domain wall is in trap 314. Thus, the bit has been programmed. If the domain wall is desired to move across multiple bits, then another current pulse may be applied to SOT line 302 or the current can remain on for an amount of time corresponding to the appropriate trap 314 being reached by the domain wall.

Racetrack memory 300 may share the benefits of racetrack memories 100, 200A, 200D and/or 200E. Because of the configured speeds of the domain walls in racetrack memory layer 310, domain walls move rapidly through bit locations 312 and slowly through traps. Thus, programming may be accomplished relatively quickly, the timing for programming of racetrack memory 300 may be less tightly controlled, racetrack memory 300 may be less prone to write errors, and the domain walls may be more readily de-pinned from traps 314. Thus, performance, speed and accuracy of racetrack memory 300 may be improved.

Figure 4:
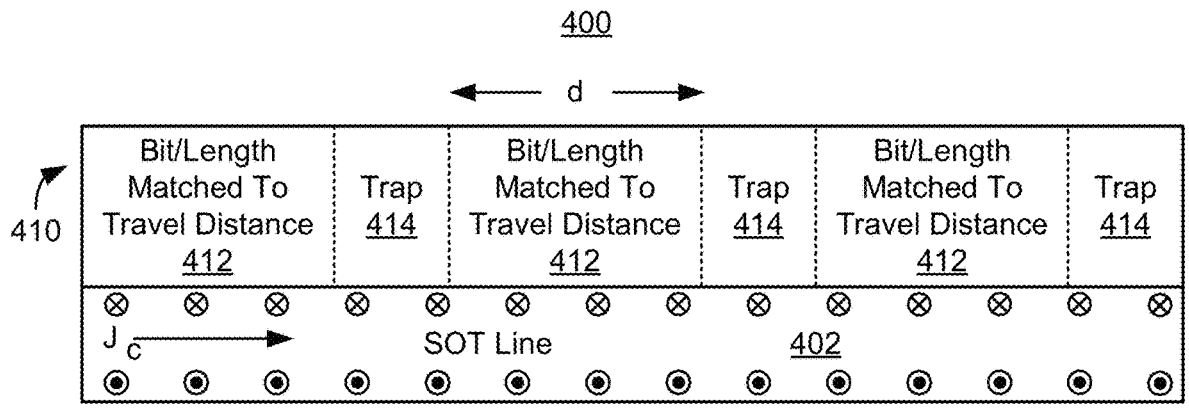
FIG. 4 depicts an embodiment of a portion of a racetrack memory having improved domain wall speed.

FIG. 4 depicts an embodiment of a portion of a racetrack memory 400 having improved domain wall speed and performance of such a memory. For clarity, not all of racetrack memory 400 is depicted and FIG. 4 is not to scale. Racetrack memory 400 is analogous to racetrack memories 100, 200A, 200D, 200E, and/or 300. Racetrack memory 300 includes SOT line 302 and racetrack memory layer 310 that are analogous to SOT lines 102, 202, and 302 and racetrack memory layers 110, 210A, 210D, 210E and 300, respectively. Thus, analogous material(s) may be used for racetrack memory layer 410 and SOT line 402 as for racetrack memory layers 110, 210A, 210D, 210E and 310 and SOT lines 102, 202 and 302, respectively. Further, the functions of racetrack memory layer 210 and SOT line 302 are analogous to the functions of racetrack memory layer 110, 210A, 210D and 210E and SOT lines 102 and 202, respectively.

Racetrack memory layer 410 includes bit locations 412 and domain wall traps 414. Bit locations 412 and domain wall traps 414 are analogous to bit locations 112, 212, and 312 and domain wall traps 114, 214 and 314, respectively. Thus, domain walls have a first domain wall speed in bit locations 412 and a second domain wall speed in traps 414. The second domain wall speed is less than the first domain wall speed.

Racetrack memory layer 410 is configured based on the intrinsic travel distance of domain walls within the material(s) used in racetrack memory layer 410. The intrinsic travel distance is the distance the domain walls travel before beginning to slow or stop. The intrinsic travel distance can be controlled by parameters such as the magnitude of the write current driven through SOT line 402, the spin Hall anisotropy (SHA) of material(s) used in racetrack memory layer 410, the anisotropy (Ku) of material(s) used in racetrack memory layer 410, and/or the damping ($\alpha$) for material(s) used in racetrack memory layer 410. The intrinsic travel distance is less than one hundred nanometers. In some embodiments, the intrinsic travel distance may be at least twenty nanometers and not more than one hundred nanometers. Other intrinsic travel distances, including smaller intrinsic travel distance, are possible. In some embodiments, the (higher) first domain wall speed in the bit locations 412 and the (lower) second domain wall speed in traps 414 are due to the separation distance, d, between domain wall traps 414. The separation distance corresponds to the intrinsic travel distance for the domain wall. In some embodiments, the separation distance is equal to the intrinsic travel distance. For example, the separation distance may be at least twenty nanometers and not exceeding one hundred nanometers. Because the separation distance corresponds to the intrinsic travel distance, the domain wall slows at or near the travel distance. Thus, the domain wall slows at or near traps 414.

To program racetrack memory 400, a write current is driven in SOT line 402. This current results in the spin polarization in SOT line 402, which generates SOT in racetrack memory layer 410. The domain wall in trap 414 is readily de-pinned and moves with increasing velocity as current increases in SOT line 402. The domain wall rapidly crosses bit location 412. The domain wall moves to the next trap 414 and slows because the intrinsic travel distance has been met (e.g. because the separation distance is substantially the same as the intrinsic travel distance). As a result, the current may be removed while the domain wall is in trap 414. Thus, the bit has been programmed. If the domain wall is desired to move across multiple bits, then another current pulse may be applied to SOT line 402 or the current can remain on for an amount of time corresponding to the appropriate trap 414 being reached by the domain wall.

Racetrack memory 400 may share the benefits of racetrack memories 100, 200A, 200D, 200E and/or 300. Because the separation distance corresponds to the intrinsic travel distance, domain walls move rapidly through bit locations 412 and slowly through traps 414. Thus, programming may be accomplished relatively quickly, the timing for programming of racetrack memory 400 may be less tightly controlled, racetrack memory 400 may be less prone to write errors, and the domain walls may be more readily de-pinned from traps 414. Thus, performance, speed and accuracy of racetrack memory 400 may be improved.

Various techniques have been described for controlling domain wall motion in racetrack memories 100, 200A, 200D, 200E, 300 and 400. One of ordinary skill in the art will recognize that some or all of these techniques may be combined in manners not explicitly described herein.

Figure 5:
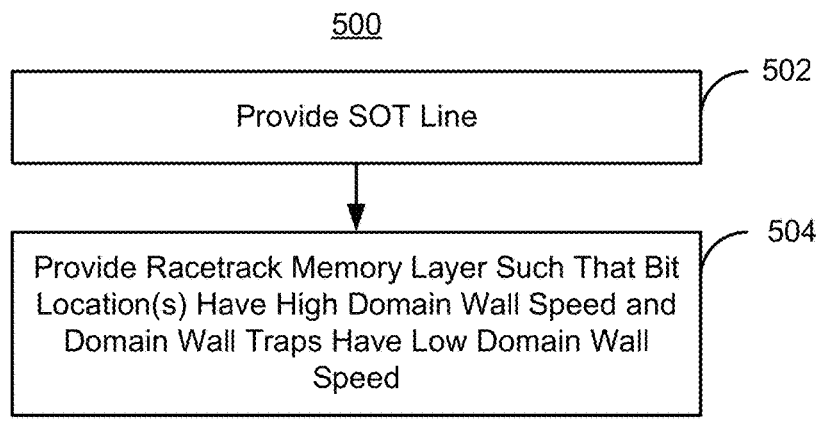
FIG. 5 is a flow-chart depicting an embodiment of a method for providing a portion of a racetrack memory having improved domain wall speed.

FIG. 5 is a flow-chart depicting an embodiment of method 500 for providing a portion of a racetrack memory having improved domain wall speed. Although certain processes are depicted, additional processes may be used and/or the order may be changed.

An SOT line is provided, at 502. In some embodiments, the material(s) for the SOT line are deposited and the line defined, for example using photolithography. In some embodiments, SOT line may be deposited in a pre-formed trench or aperture(s) in a mask. The mask is removed, leaving the SOT line. In some embodiments, other layers such as the racetrack memory layer, any DMI control layer(s) and/or a ferromagnetic layer in combination with a nonmagnetic coupling layer, are provided before the SOT line is photolithographically defined, e.g. by etching.

The racetrack memory layer is provided, at 504. As part of 504, the bit locations and domain wall traps are also formed in the racetrack memory layer. For example, portions of racetrack memory layer may be processed to change the DMI, domain wall traps may be separated by the intrinsic travel distance, and/or the DMI of the racetrack memory layer may be configured by fabricating other structures such as a DMI control layer and/or a SAF structure. Fabrication of the racetrack memory may then be completed.

For example, racetrack memory 100 may be fabricated using method 500. SOT line 102 is provided, at 502. Racetrack memory layer 110 is provided on SOT line 102, at 504. As part of 504, racetrack memory layer 110 may be processed (e.g. subjected to ion implantation or thinning), DMI control layer(s) (not shown in FIG. 1A) and/or a SAF structure (not shown in FIG. 1A) may also be provided. In another example, racetrack memory 400 may be fabricated using method 500. SOT line 402 is provided, at 502. Racetrack memory layer 410 is provided on SOT line 402, at 504. For example, bit locations 412 and traps 414 are set such that the separation distance corresponds to the intrinsic travel distance. Thus, using method 500, a racetrack memory enjoying the benefits described herein may be manufactured.

Figure 6:
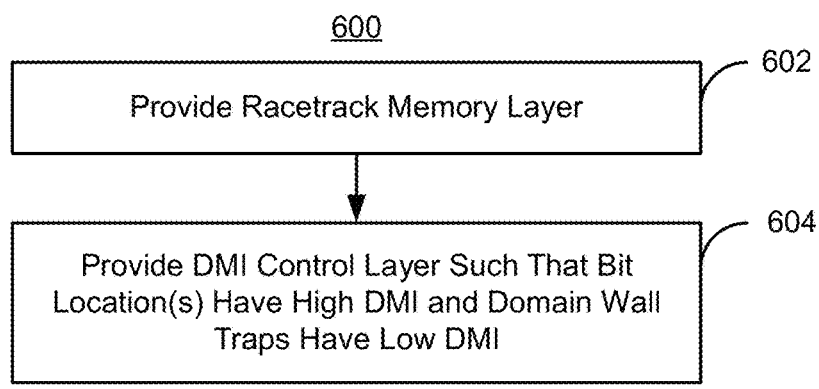
FIG. 6 is a flow-chart depicting an embodiment of a method for providing a portion of a racetrack memory having improved domain wall speed.

FIG. 6 is a flow-chart depicting an embodiment of method 600 for providing a portion of a racetrack memory having improved domain wall speed. Although certain processes are depicted, additional processes may be used and/or the order may be changed. In some embodiments, method 600 may be viewed as implementing 504 of method 500.

A racetrack memory layer is provided, at 602. In some embodiments, 602 includes depositing the material(s) for the racetrack memory layer and performing additional processing, such as defining the edges of the racetrack memory layer.

A DMI control layer is provided, at 604. In some embodiments, 604 includes depositing the material(s) for the DMI control layer and performing subsequent processing to form high DMI and low DMI sections. For example, a mask having apertures exposing low DMI sections may be formed. In some embodiments, the device is etched to thin or remove the material for the DMI control layer exposed by the mask. In some embodiments, ions may be implanted in the regions exposed by the apertures in the mask. Thus, the DMI of the DMI control layer may be modified. Fabrication of the racetrack memory may then be completed.

For example, racetrack memory layer 210E may be provided, at 602. At 604, DMI control layer 220E is formed. Thus, the layer is deposited and apertures 224E formed. Consequently, high DMI sections 222E remain. Fabrication of racetrack memory 200E may then be completed. Thus, using method 600, a racetrack memory enjoying the benefits described herein may be manufactured.

Figure 7:
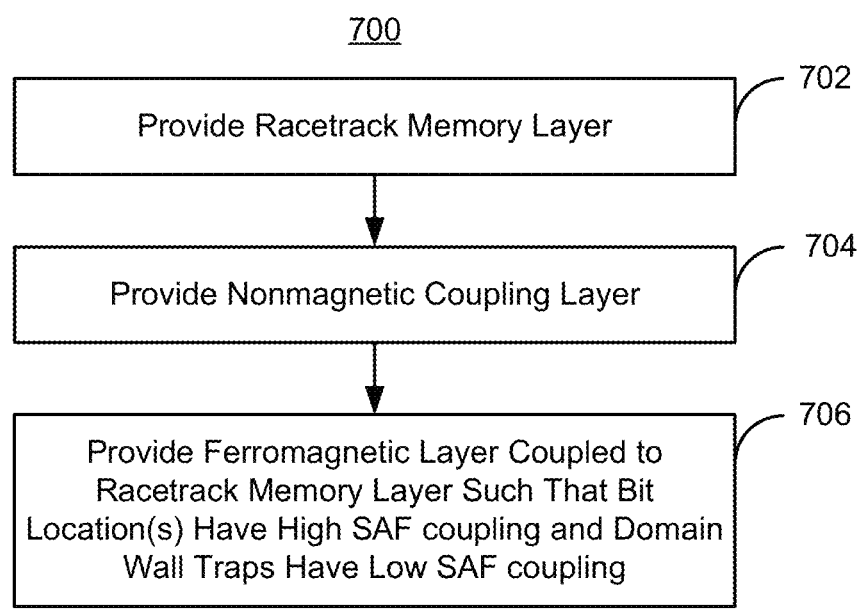
FIG. 7 is a flow-chart depicting an embodiment of a method for providing a portion of a racetrack memory having improved domain wall speed.

FIG. 7 is a flow-chart depicting an embodiment of method 700 for providing a portion of a racetrack memory having improved domain wall speed. Although certain processes are depicted, additional processes may be used and/or the order may be changed. In some embodiments, method 700 may be viewed as implementing 504 of method 500.

A racetrack memory layer is provided, at 702. In some embodiments, 702 includes depositing the material(s) for the racetrack memory layer and performing additional processing, such as defining the edges of the racetrack memory layer.

A nonmagnetic coupling layer is provided, at 704. The thickness of the nonmagnetic coupling layer is selected to provide the desired SAF coupling between the ferromagnetic layer and the racetrack memory layer.

A ferromagnetic layer is provided such that the nonmagnetic coupling layer is between the ferromagnetic layer and the recording layer, at 704. In some embodiments, 704 includes depositing the material(s) for the ferromagnetic layer and performing subsequent processing to form sections that generate a high SAF effect and a low SAF effect in bit locations and the traps, respectively, of the racetrack memory layer. For example, a mask having apertures exposing areas corresponding to a low SAF effect may be formed. In some embodiments, the device is etched to thin or remove the ferromagnetic layer exposed by the mask. In some embodiments, some or all of the nonmagnetic coupling layer exposed by the mask is also removed. Fabrication of the racetrack memory may then be completed.

For example, racetrack memory layer 310 may be provided, at 702. At 704, nonmagnetic coupling layer 320 is formed. In addition, ferromagnetic layer 330 is formed, at 706. Fabrication of racetrack memory 700E may then be completed. Thus, using method 700, a racetrack memory enjoying the benefits described herein may be manufactured.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a racetrack memory layer including:
 a plurality of bit locations; and
 a plurality of domain wall traps, the plurality of bit locations being interleaved with the plurality of domain wall traps, each of the plurality of bit locations having a first domain wall speed, each of the plurality of domain wall traps having a second domain wall speed, the first domain wall speed being greater than the second domain wall speed;
wherein the first domain wall speed and the second domain wall speed are due to at least one of a Dzyaloshinskii-Moriya interaction (DMI) variation in the racetrack memory layer, a synthetic antiferromagnetic (SAF) effect variation in the racetrack memory layer, and a separation distance for the plurality of domain wall traps corresponding to an intrinsic travel distance, the separation distance being less than one hundred nanometers.

2. The system of claim 1, wherein the first domain wall speed and the second domain wall speed are due to the DMI variation in the racetrack memory layer, wherein each of the plurality of bit locations has a first DMI, each of the plurality of domain wall traps has a second DMI, the first DMI being greater than the second DMI, and the second DMI being greater than zero and not more than 0.07 erg/cm$^2$.

3. The system of claim 2, wherein the second DMI is at least 0.01 erg/cm$^2$ and not more than 0.05 erg/cm$^2$.

4. The system of claim 2, wherein the first DMI is at least 0.07 erg/cm$^2$.

5. The system of claim 2, further comprising:
a DMI control layer configured such that the plurality of bit locations have the first DMI and the plurality of domain wall traps have the second DMI.

6. The system of claim 5, wherein the DMI control layer further includes:
a plurality of high DMI segments adjacent to the plurality of bit locations, each of the plurality of high DMI segments having a DMI of at least 0.07 erg/cm$^2$; and
at least one of a plurality of apertures and a plurality of low DMI segments, each of the plurality of low DMI segments having a DMI of not more than 0.07 erg/cm$^2$.

7. The system of claim 2, further comprising:
a DMI control layer having a control layer DMI; and
a spin orbit torque (SOT) layer configured to carry a current for programming the racetrack memory layer, the racetrack memory layer being between the SOT line and the DMI control layer, SOT line having an SOT DMI;
wherein the DMI control layer is configured such that the plurality of bit locations have the first DMI and the plurality of domain wall traps have the second DMI, the first DMI and the second DMI being based on the SOT DMI and the control layer DMI.

8. The system of claim 2, wherein the racetrack memory layer further includes:
a magnetic material having at least one of a bulk DMI and a surface DMI corresponding to the first DMI, the plurality of domain wall traps formed by ion bombardment to provide the second DMI from the at least one of the bulk DMI and the surface DMI.

9. The system of claim 1, wherein the first domain wall speed and the second domain wall speed are due to the SAF effect variation in the racetrack memory layer, the system further comprising:
a nonmagnetic coupling layer; and
a ferromagnetic layer, the nonmagnetic coupling layer being between the racetrack memory layer and the nonmagnetic coupling layer, the ferromagnetic layer being synthetic antiferromagnetically coupled with the racetrack memory layer, at least the ferromagnetic layer being configured to provide the SAF effect variation in the racetrack memory layer.

10. The system of claim 1, wherein the first domain wall speed and the second domain wall speed are due to the separation distance for the plurality of domain wall traps corresponding to the intrinsic travel distance, the separation distance being at least twenty nanometers and not exceeding one hundred nanometers.

11. A system, comprising:
a racetrack memory layer including:
a plurality of bit locations; and
a plurality of domain wall traps, the plurality of bit locations being interleaved with the plurality of domain wall traps, each of the plurality of bit locations having a first domain wall speed, each of the plurality of domain wall traps having a second domain wall speed, the first domain wall speed being greater than the second domain wall speed, the first domain wall speed and the second domain wall speed being due to at least one of a Dzyaloshinskii-Moriya interaction (DMI) variation in the racetrack memory layer, a synthetic antiferromagnetic (SAF) effect variation in the racetrack memory layer, and a separation distance for the plurality of domain wall traps corresponding to an intrinsic travel distance, the separation distance being at least twenty nanometers and not more than one hundred nanometers;
wherein for the first domain wall speed and the second domain wall speed being due to the DMI variation in the racetrack memory layer, each of the plurality of bit locations has a first DMI and each of the plurality of domain wall traps has a second DMI, the first DMI being greater than the 0.05, and the second DMI being greater than zero and not more than 0.05;
wherein for the first domain wall speed and the second domain wall speed being due to the SAF effect variation, the system further includes a nonmagnetic coupling layer and a ferromagnetic layer, the nonmagnetic coupling layer being between the ferromagnetic layer and the racetrack memory layer, the ferromagnetic layer being synthetic antiferromagnetically coupled with the racetrack memory layer, at least the ferromagnetic layer being configured to provide the SAF effect variation in the racetrack memory layer; and
a spin orbit torque (SOT) layer configured to carry a current for programming the racetrack memory layer.

12. A method for providing a magnetic device, comprising:
providing a racetrack memory layer, the providing the racetrack memory layer including:
providing a plurality of bit locations; and
providing a plurality of domain wall traps, the plurality of bit locations being interleaved with the plurality of domain wall traps, each of the plurality of bit locations having a first domain wall speed, each of the plurality of domain wall traps having a second domain wall speed, the first domain wall speed being greater than the second domain wall speed;
wherein the first domain wall speed and the second domain wall speed are due to at least one of a Dzyaloshinskii-Moriya interaction (DMI) variation in the racetrack memory layer, a synthetic antiferromagnetic (SAF) effect variation in the racetrack memory layer, and a separation distance for the plurality of domain wall traps corresponding to an intrinsic travel distance, the separation distance being at least twenty nanometers and not more than one hundred nanometers.

13. The method of claim 12, wherein the first domain wall speed and the second domain wall speed are due to the DMI variation in the racetrack memory layer, and wherein the providing the racetrack memory layer further includes:
configuring each of the plurality of bit locations to have a first DMI and each of the plurality of domain wall traps to have a second DMI, the first DMI being greater than the second DMI, and the second DMI being greater than 0.01 erg/cm$^2$ and not more than 0.07 erg/cm$^2$.

14. The method of claim 13, wherein the first DMI is greater than 0.07 erg/cm$^2$ and the second DMI is not more than 0.05 erg/cm$^2$.

15. The method of claim 13, wherein the configuring further includes:
providing a DMI control layer configured such that the plurality of bit locations have the first DMI and the plurality of domain wall traps have the second DMI.

16. The method of claim 15, wherein the providing the DMI control layer further includes:
providing a plurality of high DMI segments adjacent to the plurality of bit locations, each of the plurality of high DMI segments having a DMI of at least 0.07 erg/cm$^2$; and providing at least one of a plurality of apertures and a plurality of low DMI segments, each of the plurality of low DMI segments having a DMI of not more than 0.07 erg/cm$^2$.

17. The method of claim 13, wherein the configuring further includes:
  providing a spin orbit torque (SOT) layer configured to carry a current for programming the racetrack memory layer, the racetrack memory layer being between the SOT line and the DMI control layer, SOT line having an SOT DMI; and
  providing a DMI control layer configured such that the plurality of bit locations have the first DMI and the plurality of domain wall traps have the second DMI, the first DMI and the second DMI being based on the SOT DMI and a control layer DMI.

18. The method of claim 13, wherein the providing the racetrack memory layer further includes:
  providing a magnetic material having at least one of a bulk DMI and a surface corresponding to the first DMI; and
  ion bombarding a portion of the magnetic material corresponding to the plurality of domain wall traps to provide the second DMI from the at least one of the bulk DMI and the surface DMI.

19. The method of claim 12, wherein the first domain wall speed and the second domain wall speed are due to the SAF effect variation in the racetrack memory layer, the method further comprising:
  providing a nonmagnetic coupling layer; and
  providing a ferromagnetic layer such that the nonmagnetic coupling layer is between the ferromagnetic layer and the racetrack memory layer, the ferromagnetic layer being synthetic antiferromagnetically coupled with the racetrack memory layer, at least the ferromagnetic layer being configured to provide SAF effect variation in the racetrack memory layer.

20. The method of claim 12, wherein the first domain wall speed and the second domain wall speed are due to the separation distance for the plurality of domain wall traps corresponding to the intrinsic travel distance, the separation distance being at least twenty nanometers and not exceeding one hundred nanometers.

* * * * *